(12) United States Patent
Chen

(10) Patent No.: US 10,558,246 B2
(45) Date of Patent: Feb. 11, 2020

(54) CHASSIS DEVICE, AND COVER STRUCTURE AND MAGNETIC SECURING MECHANISM THEREOF

(71) Applicant: COOLER MASTER TECHNOLOGY INC., New Taipei (TW)

(72) Inventor: Yung-Hao Chen, New Taipei (TW)

(73) Assignee: COOLER MASTER TECHNOLOGY INC., New Taipei (TW)

(*) Notice: Subject to any disclaimer, the term of this patent is extended or adjusted under 35 U.S.C. 154(b) by 606 days.

(21) Appl. No.: 15/375,089

(22) Filed: Dec. 11, 2016

(65) Prior Publication Data

US 2017/0344076 A1 Nov. 30, 2017

Related U.S. Application Data

(60) Provisional application No. 62/343,141, filed on May 31, 2016.

(51) Int. Cl.

| | | |
|---|---|---|
| *E05C 17/56* | (2006.01) | |
| *G06F 1/18* | (2006.01) | |
| *H05K 7/20* | (2006.01) | |
| *E05C 19/16* | (2006.01) | |
| *G06F 1/20* | (2006.01) | |

(52) U.S. Cl.
CPC .......... *G06F 1/181* (2013.01); *H05K 7/20009* (2013.01); *E05C 17/56* (2013.01); *E05C 19/16* (2013.01); *G06F 1/20* (2013.01); *Y10T 292/11* (2015.04)

(58) Field of Classification Search
CPC .......... E05C 17/56; E05C 19/16; Y10T 292/11

USPC ..................................................... 292/251.5
See application file for complete search history.

(56) References Cited

U.S. PATENT DOCUMENTS

| | | | | | |
|---|---|---|---|---|---|
| 2,719,050 | A | * | 9/1955 | Teetor | E05C 19/16 292/251.5 |
| 2,808,281 | A | * | 10/1957 | Poe | E05C 19/16 292/251.5 |
| 3,247,924 | A | * | 4/1966 | Price | E05B 77/54 180/289 |

(Continued)

FOREIGN PATENT DOCUMENTS

| | | | | | |
|---|---|---|---|---|---|
| CH | 351186 | A | * 12/1960 | ............ | E05C 19/16 |
| DE | 2438312 | A1 | * 2/1976 | ............ | E05C 19/16 |

(Continued)

*Primary Examiner* — Carlos Lugo
(74) *Attorney, Agent, or Firm* — Maschoff Brennan

(57) ABSTRACT

A chassis device and its cover structure and lifting mechanism, the chassis structure includes a chassis, a cover and a lifting mechanism further including a first magnetic member fixed to the cover, a second magnetic member fixed to the chassis; a movable sleeve sheathed on the second magnetic member and capable of sliding with respect to the second magnetic member, an elastic element installed between the chassis and the movable sleeve and pushing the movable sleeve away from the chassis to resume its original position, and a third magnetic member fixed to the movable sleeve, and the third magnetic member has a side attracted or repelled with respect to the first magnetic member and the other side attracted or repelled with respect to the second magnetic member. The second and third magnetic members have a magnetic attraction force greater than an elastic restoring force of the elastic element.

26 Claims, 13 Drawing Sheets

(56) References Cited

U.S. PATENT DOCUMENTS

| | | | | | |
|---|---|---|---|---|---|
| 3,600,025 | A | * | 8/1971 | Brainard | E05O 19/165 292/251.5 |
| 4,099,755 | A | * | 7/1978 | Anderson | E05C 19/16 292/251.5 |
| 4,915,431 | A | * | 4/1990 | Bailey | E05C 19/166 292/251.5 |
| 4,995,655 | A | * | 2/1991 | Freeman | E05C 17/56 292/251.5 |
| 5,082,317 | A | * | 1/1992 | Delaney, Jr. | E05C 17/56 292/251.5 |
| 5,312,144 | A | * | 5/1994 | Yoshida | G06F 1/183 24/303 |
| 5,409,275 | A | * | 4/1995 | Yoshida | C23C 16/45561 220/230 |
| 5,996,831 | A | * | 12/1999 | Teok | E05B 47/004 220/230 |
| 7,165,792 | B2 | * | 1/2007 | Queveau | B60J 5/0458 292/144 |
| 7,393,027 | B1 | * | 7/2008 | Chen | E05C 17/56 16/82 |
| 7,819,441 | B1 | * | 10/2010 | Conran | E05C 17/56 16/82 |

FOREIGN PATENT DOCUMENTS

| | | | | | |
|---|---|---|---|---|---|
| FR | 1172275 | A | * | 2/1959 | E05C 19/16 |
| FR | 1319358 | A | * | 3/1963 | E05C 19/16 |
| FR | 2233864 | A5 | * | 1/1975 | E05C 19/16 |

* cited by examiner

CHASSIS DEVICE, AND COVER STRUCTURE AND MAGNETIC SECURING MECHANISM THEREOF

CROSS-REFERENCE TO RELATED APPLICATION

This patent application claims the benefit of U.S. Provisional Patent Application No. 62/343,141 filed May 31, 2016, which is incorporated by reference herein.

FIELD OF THE INVENTION

This disclosure relates to a chassis device, and more particularly to a chassis device and its cover structure and lifting mechanism.

BACKGROUND OF THE INVENTION

In general, most conventional silent computer chasses provided for reducing noises produced during the operation of devices such as fans and hard disks come with a closed chassis structure. For example, narrow ventilation holes are used to replace the heat dissipating windows disposed on the front and real panels, or a cover is closed only in a silent mode.

However, the aforementioned silent computer chassis has the following drawback. Since the ventilation holes formed on the chassis may cause a poor air circulation, the overall heat dissipating efficiency of the silent computer chassis is lower than the general computer chassis.

In view of the aforementioned drawback of the prior art, the discloser of this disclosure based on years of experience in the related industry to conduct extensive research, and finally designed a chassis device and its cover structure and lifting mechanism to overcome the drawbacks of the prior art.

SUMMARY OF THE INVENTION

Therefore, it is a primary objective of the present invention to provide a chassis device and its cover structure and lifting mechanism, and the lifting mechanism is provided for lifting to form a spacing between the chassis and the cover, so as to achieve the effects of improving the air circulation inside the chassis structure as well as maintaining a low noise level of the chassis structure.

To achieve the aforementioned and other objectives, this disclosure provides a lifting mechanism, comprising: a first magnetic member; a second magnetic member; a movable sleeve, sheathed on the second magnetic member and capable of sliding with respect to the second magnetic member; an elastic element, pushing and driving the movable sleeve away from the second magnetic member to resume its original position; and a third magnetic member, fixed to the movable sleeve, and having a side attracted or repelled with respect to the first magnetic member and the other side attracted or repelled with respect to the second magnetic member, and the second magnetic member and the third magnetic member having a magnetic attraction force greater than an elastic restoring force of the elastic element.

To achieve the aforementioned and other objectives, this disclosure provides a cover structure comprising a cover; and a lifting mechanism as disclosed above, and the first magnetic member is fixed to the cover.

To achieve the aforementioned and other objectives, this disclosure provides a chassis device, comprising: a chassis, having an opening; a cover, covered onto the opening; and at least one lifting mechanism, further comprising: a first magnetic member, fixed to the cover; a second magnetic member, fixed to the chassis; a movable sleeve, sheathed on the second magnetic member, and capable of sliding with respect to the second magnetic member; an elastic element, installed between the chassis and the movable sleeve, and the elastic element pushes and drives the movable sleeve away from the chassis to resume its original position; and a third magnetic member, fixed to the movable sleeve, and having a side attracted or repelled with respect to the first magnetic member and the other side attracted or repelled with respect to the second magnetic member, and the second magnetic member and the third magnetic member having a magnetic attraction force greater than the elastic resuming force of the elastic element.

DESCRIPTION OF THE PREFERRED EMBODIMENTS

Figure 1:
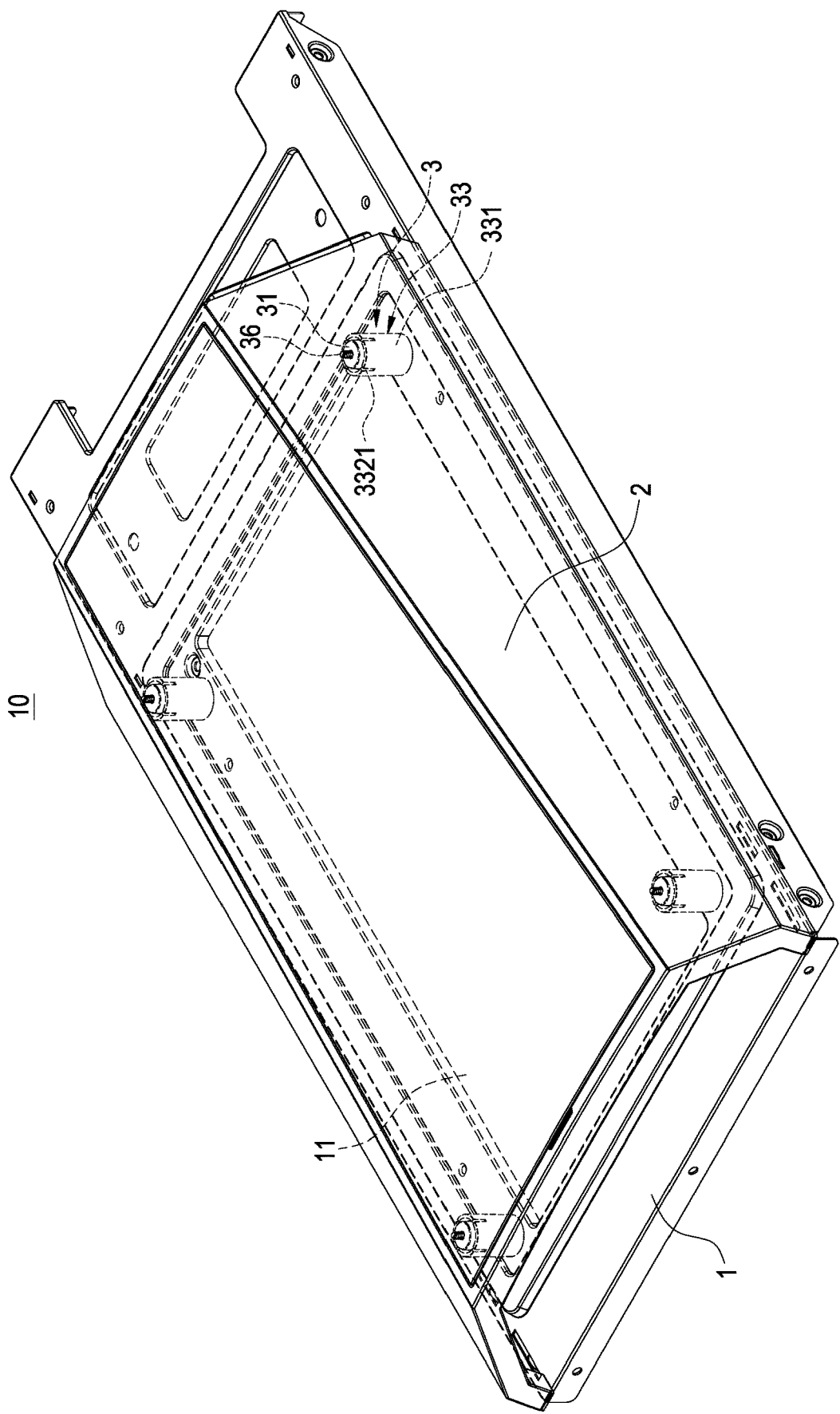
FIG. 1 is a perspective view of a chassis structure of this disclosure.
Figure 2:
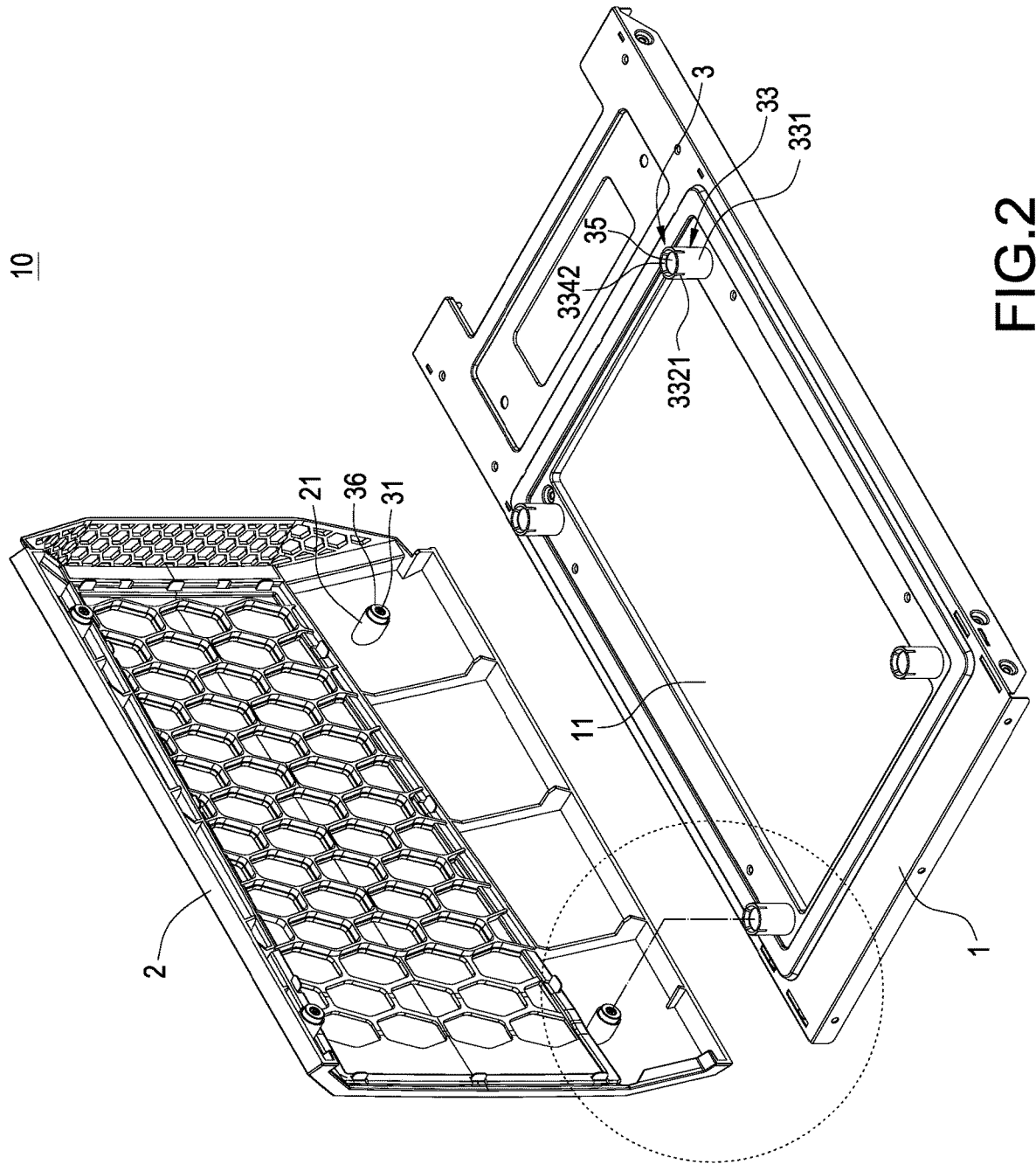
FIG. 2 is a first exploded view of a chassis structure of this disclosure.

The technical contents of the present invention will become apparent with the detailed description of preferred embodiments accompanied with the illustration of related drawings as follows. It is noteworthy that the preferred embodiments are provided for illustrating this disclosure rather than restricting the scope of the disclosure.

With reference to FIGS. 1 to 11 for a chassis device and its cover structure and lifting mechanism of this disclosure, the chassis structure 10 comprises a chassis 1, a cover 2 and one or more lifting mechanisms 3; the cover structure comprises a cover and one or more lifting mechanisms 3; and the lifting mechanism 3 comprises a first magnetic member 31, a second magnetic member 32, a movable sleeve 33, an elastic element 34 and a third magnetic member 35.

In FIGS. 1 to 7, the chassis 1 has an opening 11 and one or more first locking holes 12 disposed adjacent to the opening 11; and a cover 2, covered onto the opening 11, and having one or more lugs 21 extended from the cover 2, and each lug 21 having a first screw hole 22.

In FIGS. 1 to 7, the quantity of the lifting mechanism 3 may be singular or plural, and the quantity of the first locking hole(s) 12, the quantity of the lug(s) 21 and the quantity of the lifting mechanism(s) 3 may be equal. Wherein, if the quantity of the lifting mechanisms 3 is plural, then the lifting mechanisms 3 are disposed around the periphery of the opening 11. Wherein, each lifting mechanism 3 further comprises a first screw 36 and a second screw 37.

Figure 3:
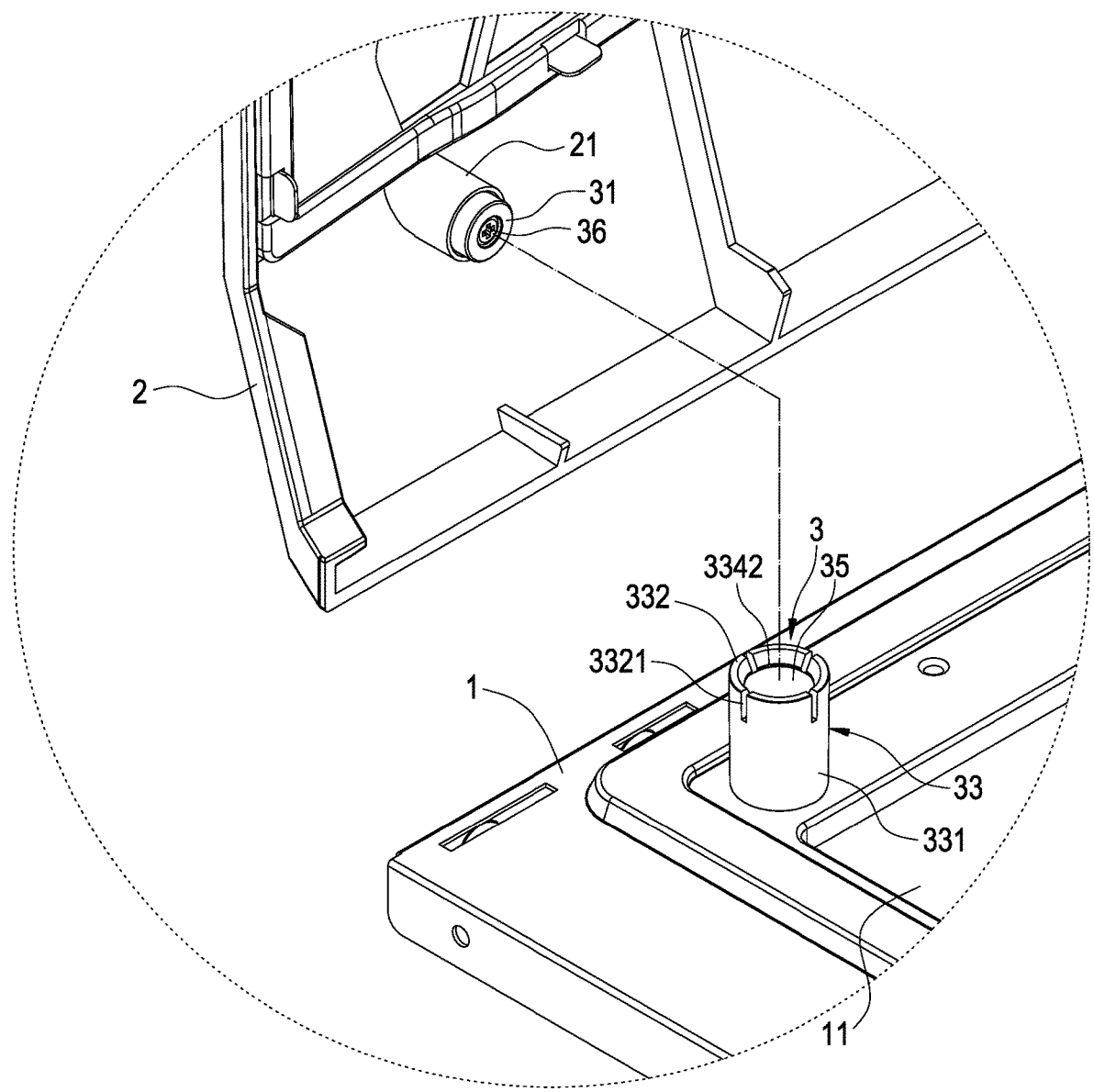
FIG. 3 is a second exploded view of a chassis structure of this disclosure.
Figure 4:
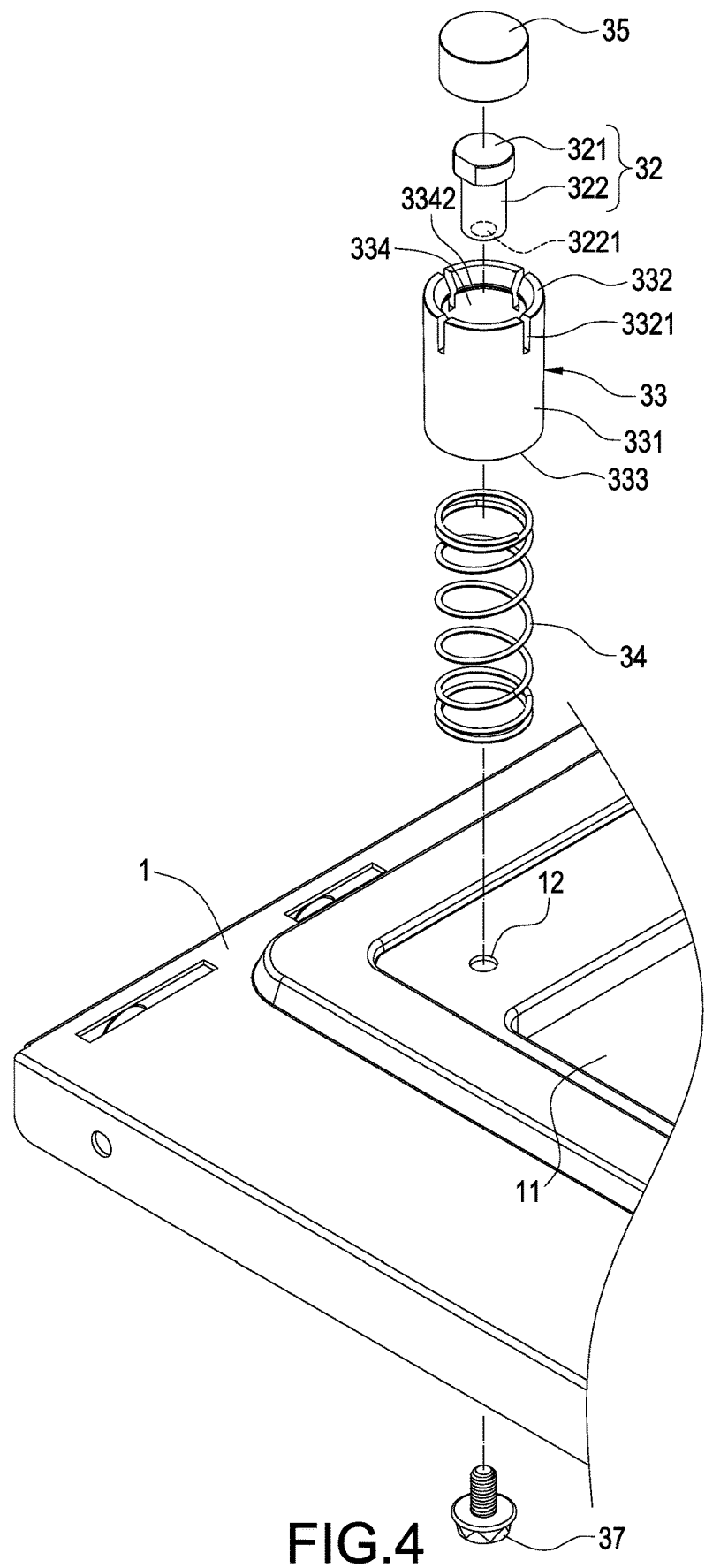
FIG. 4 is a third exploded view of a chassis structure of this disclosure.
Figure 5:
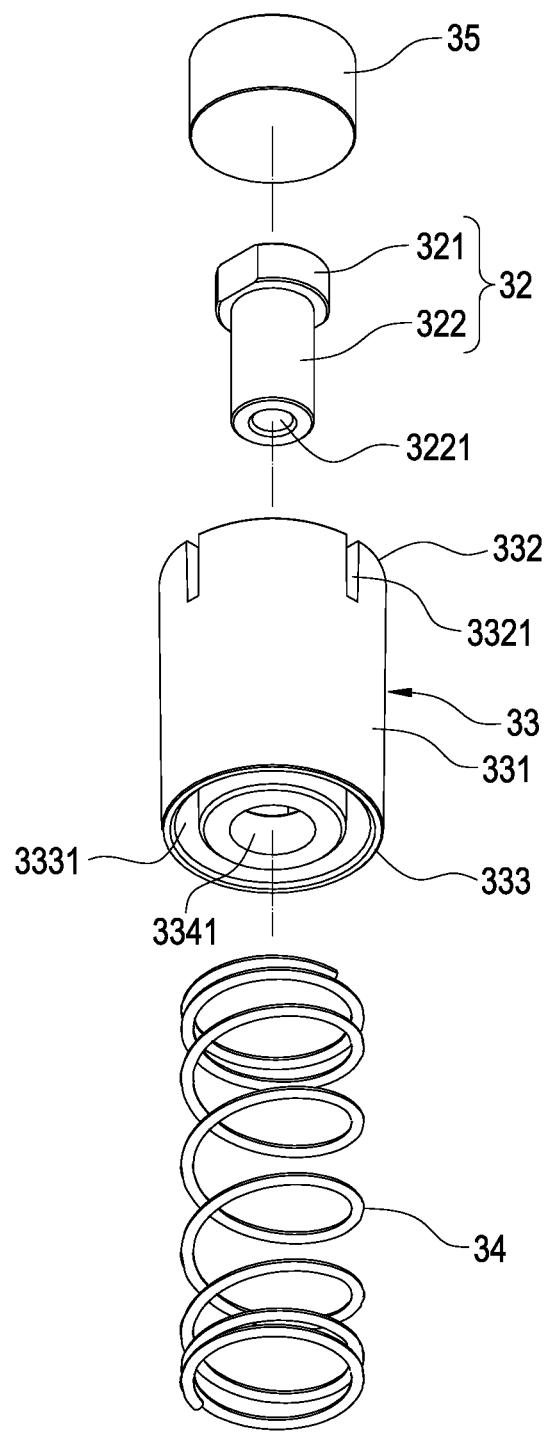
FIG. 5 is a fourth exploded view of a chassis structure of this disclosure.
Figure 6:
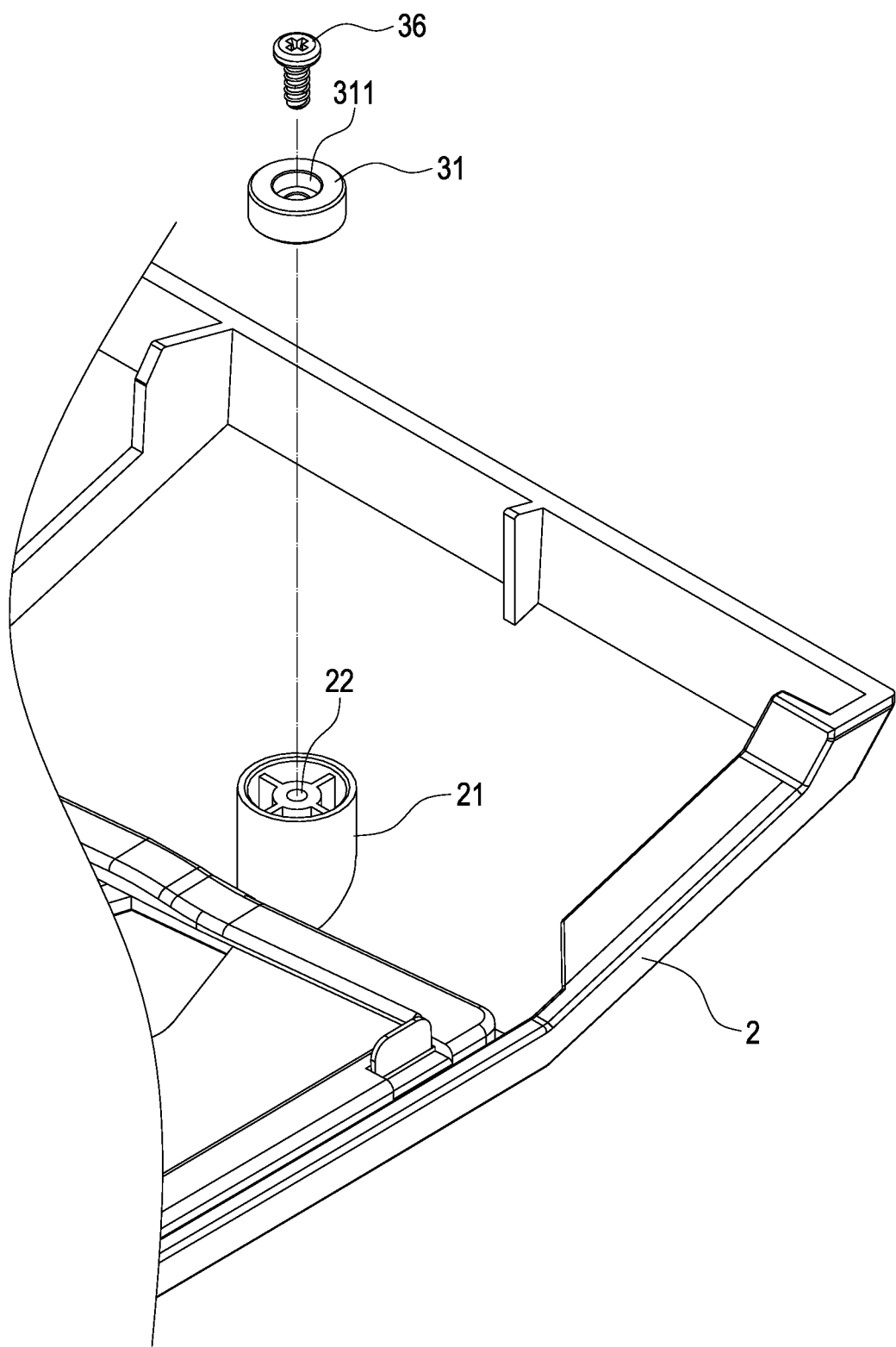
FIG. 6 is a fifth exploded view of a chassis structure of this disclosure.
Figure 7:
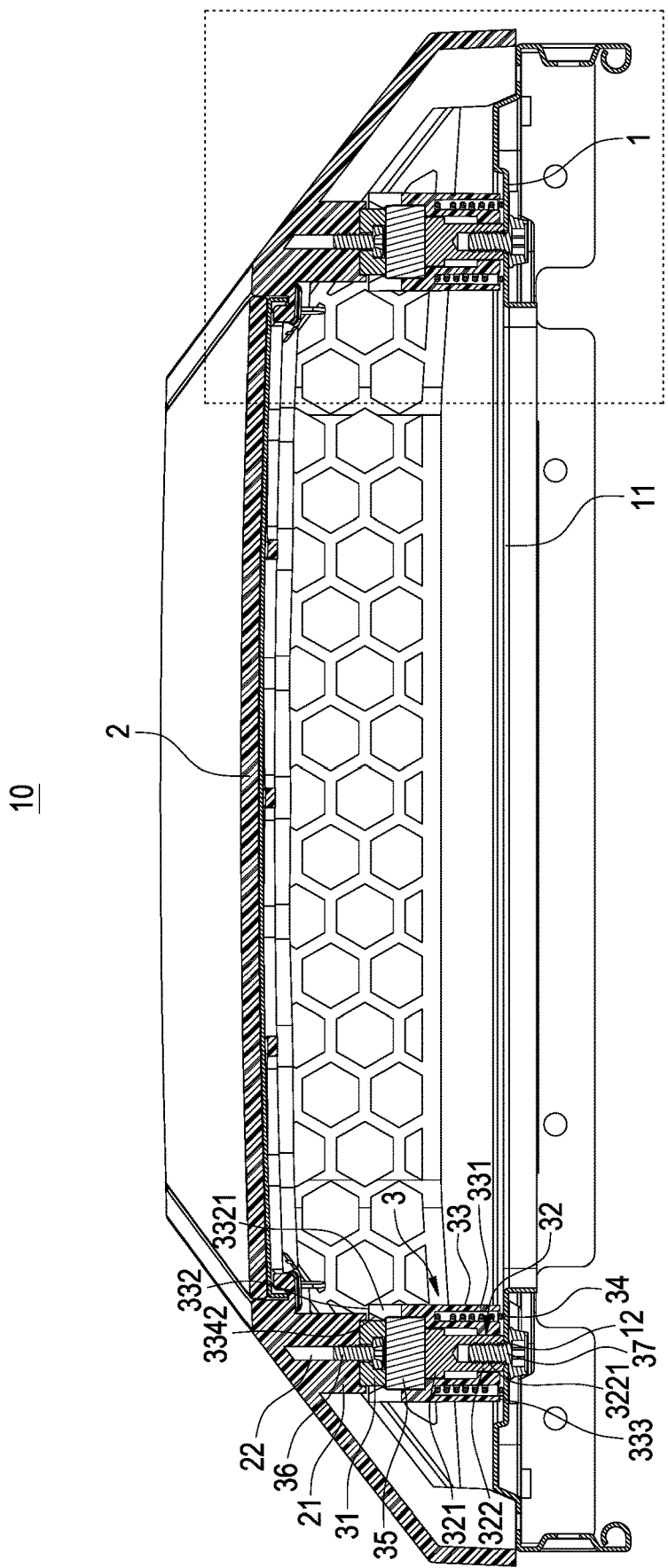
FIG. 7 is a schematic view of a first using status of a chassis structure of this disclosure.

In FIGS. 3, 6 and 7, each first magnetic member 31 has a second screw hole 311, and each first screw 36 is screwed and secured to each first screw hole 22 and each second screw hole 311 to fix each first magnetic member 31 to the cover 2.

In FIGS. 3 to 5 and 7, each second magnetic member 32 is fixed to the chassis 1. Further, each magnetic member 32 has a head portion 321 and a rod portion 322, and each head portion 321 has an external diameter greater than the external diameter of each rod portion 322, and each rod portion 322 has a second locking hole 3221, and each second screw 37 is screwed and secured into each first locking hole 12 and each second locking hole 3221 to fix each rod portion 322 to the chassis 1.

In addition, each movable sleeve 33 is sheathed on each second magnetic member 32 and capable of sliding with respect to each second magnetic member 32. In this embodiment, each movable sleeve 33 is a cylindrical member 331, and the cylindrical member 331 has a top wall 332, a bottom wall 333 and an inner ring wall 334, and the top wall 332 has a plurality of sectional grooves 3321 inwardly formed along the axial direction of the cylindrical member 331, and the bottom wall 333 has an annular groove 3331 inwardly formed on the bottom wall 333, and the inner ring wall 334 has a first latch block 3341 disposed adjacent to the bottom wall 333, and the inner ring wall 334 has a plurality of second latch blocks 3342 disposed between the plurality of sectional grooves 3321 and having a thickness gradually increasing in a direction away from the top wall 332, and the inner ring wall 334 has a third latch block 3343 disposed between the first latch block 3341 and the second latch block 3342. Wherein, each first latch block 3341 and the head portion 321 stop and limit one another.

In addition, the elastic element 34 is accommodated in the annular groove 3331, and the elastic element 34 is installed between the chassis 1 and the movable sleeve 33, and the elastic element 34 pushes the movable sleeve 33 to move away from the chassis 1 to resume its original position.

In addition, each third magnetic member 35 is installed between each cylindrical member 331, the plurality of second latch blocks 3342, and each third latch block 3343 to fix each third magnetic member 35 to each movable sleeve 33.

Wherein, the third magnetic member 35 has a side attracted or repelled with respect to the first magnetic member 31 and the other side attracted or repelled with respect to the second magnetic member 32, and the magnetic attraction force between the second magnetic member 32 and the third magnetic member 35 is greater than the elastic restoring force of the elastic element 34.

In addition, first magnetic member 31 and second magnetic member 32 are magnets, and the third magnetic member 35 is made of a magnetized material; or when the first magnetic member 31 and the second magnetic member 32 are made of a magnetized material, the third magnetic member 35 is a magnet.

In FIGS. 7 to 11, the chassis structure 10 of this disclosure comprises: a chassis 1 having an opening 11; a cover 2 covered onto the opening 11; a first magnetic member 31 fixed to the cover 2; a second magnetic member 32 fixed to the chassis 1; a movable sleeve 33 sheathed on the second magnetic member 32 and capable of sliding with respect to the second magnetic member 32; an elastic element 34 installed between the chassis 1 and the movable sleeve 33, and pushing the elastic element 34 to move away from the chassis 1 to resume its original position; a third magnetic member 35 fixed to the movable sleeve 33 and having a side capable of attracting or repelling with respect to the first magnetic member 31 and the other side capable of attracting or repelling with respect to the second magnetic member 32, and the second magnetic member 32 and the third magnetic member 35 having a magnetic attraction force greater than an elastic restoring force of the elastic element 34. The lifting mechanism 3 is capable of lifting to form a spacing between the chassis 1 and the cover 2, so as to achieve the effects of improving the air circulation inside the spacing and maintaining a low noise level of the chassis structure 10.

Figure 8:
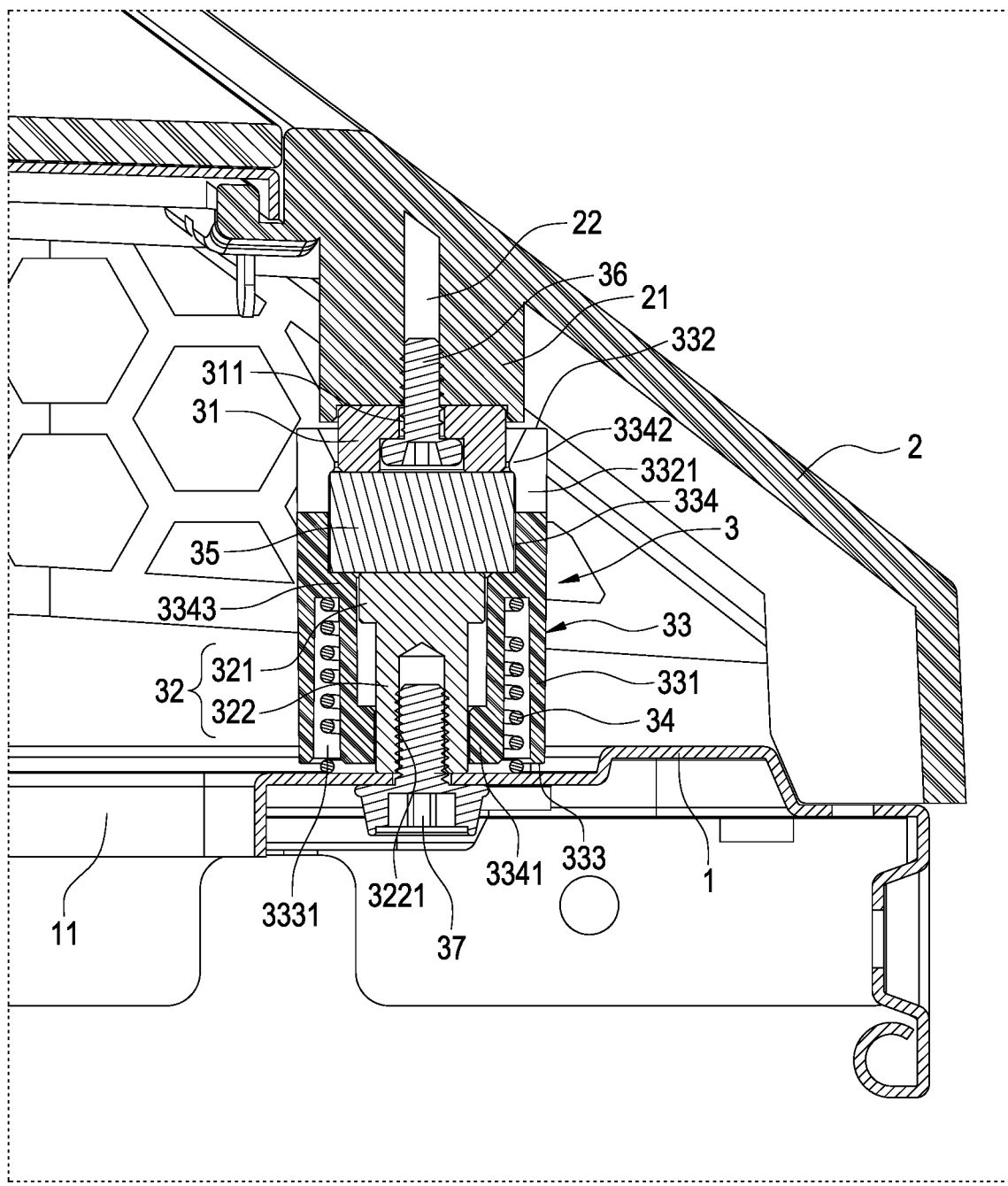
FIG. 8 is a first sectional blowup view of a chassis structure of this disclosure.

FIGS. 7 to 11 show different using statuses of a chassis structure 10 of this disclosure. In the first using status as shown in FIGS. 7 and 8, each first magnetic member 31 on the cover 2 corresponsive to each third magnetic member 35 of the chassis 1 is magnetically attracted, the cover 2 is pushed towards the chassis 1, so that each third magnetic member 35 corresponsive to each second magnetic member 32 is magnetically attracted, since the second magnetic member 32 and the third magnetic member 35 have a magnetic attraction force greater than an elastic restoring force of the elastic element 34. Therefore, the cover 2 can resist the elastic restoring force of the elastic element 34 to get close to the chassis 1 and cover the opening 11. As a result, the whole chassis structure 10 is sealed to isolate the noise inside the chassis structure 10, so as to achieve an excellent silent and soundproof effect of the chassis structure 10.

Figure 9:
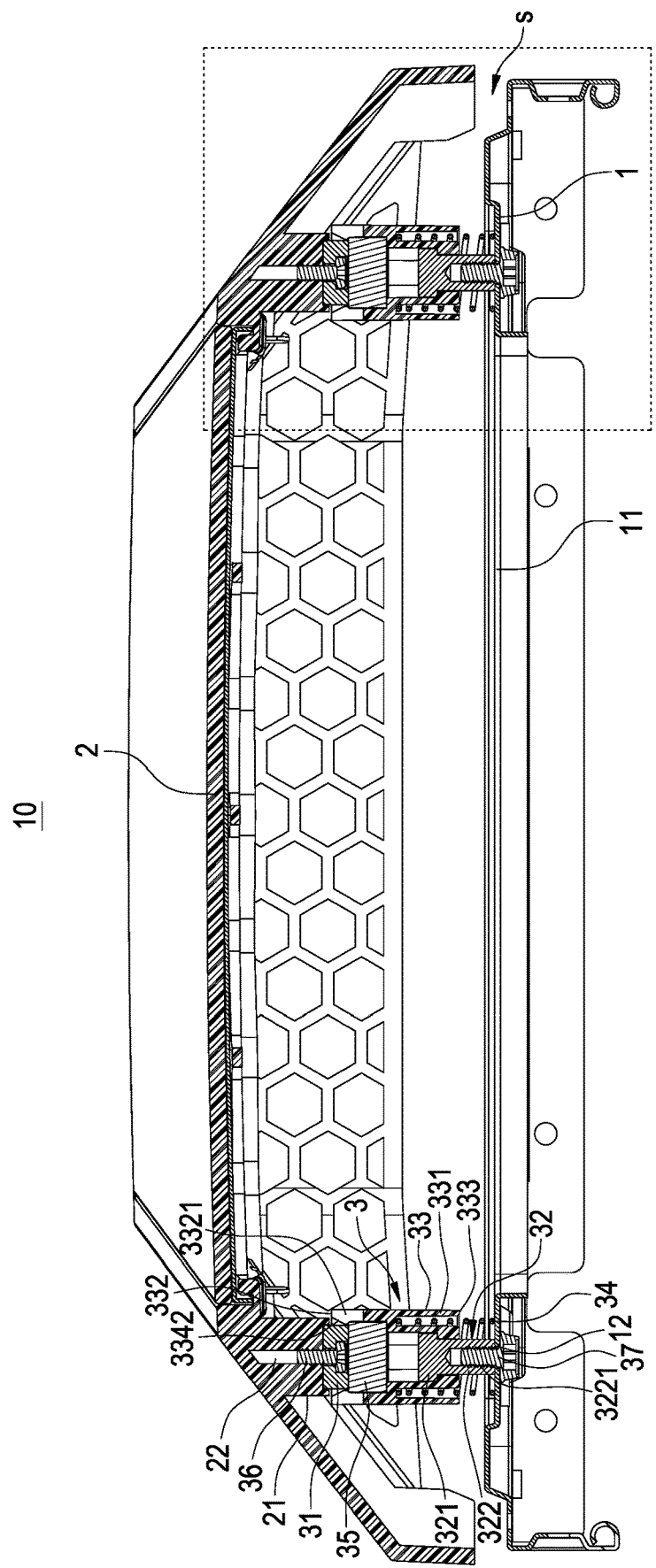
FIG. 9 is a schematic view of a second using status of a chassis structure of this disclosure.
Figure 10:
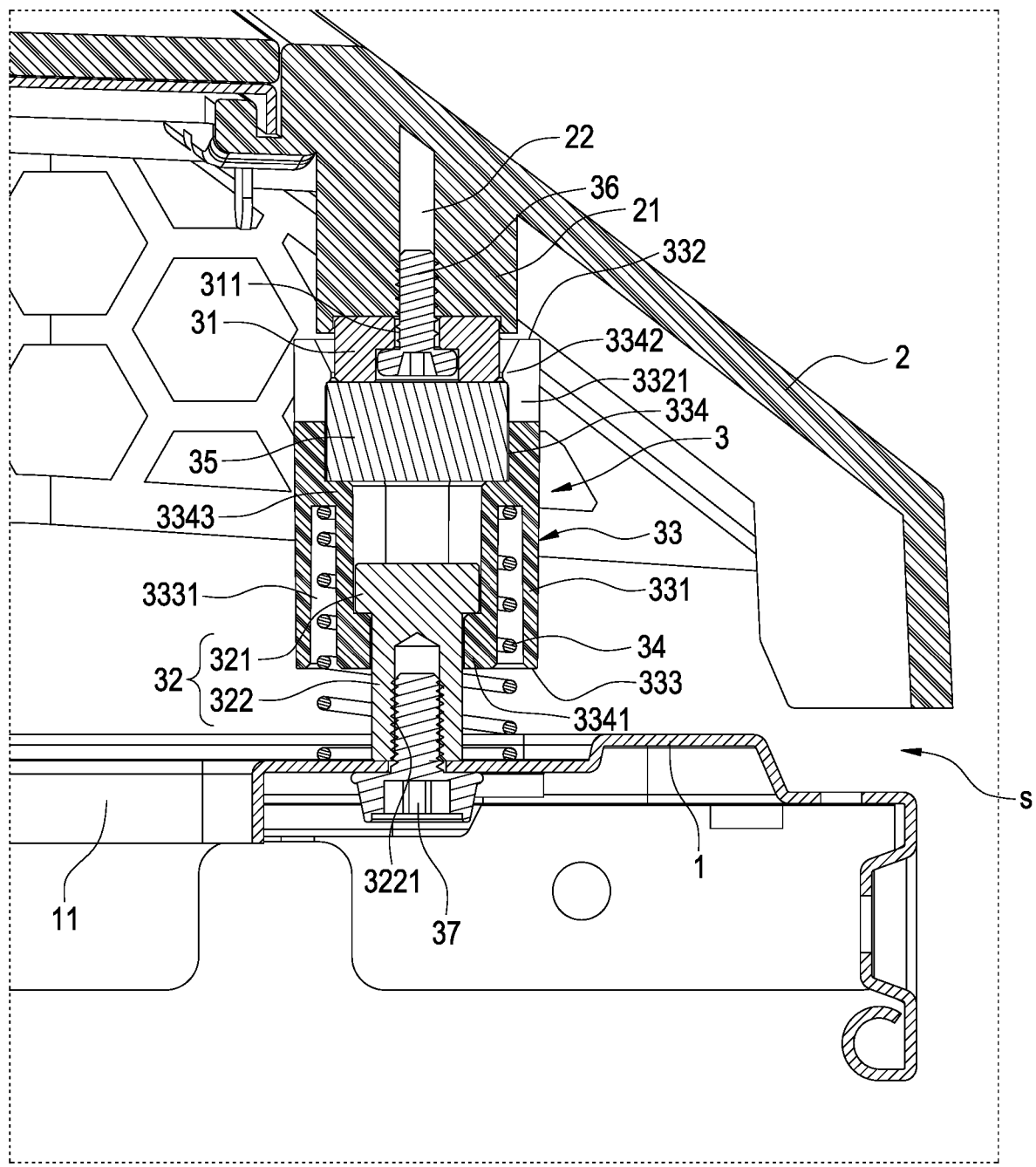
FIG. 10 is a second sectional blowup view of a chassis structure of this disclosure.

In the second using status as shown in FIGS. 9 and 10, the cover 2 is pulled in a direction away from the chassis 1, so that the magnetic attraction between each third magnetic member 35 and each second magnetic member 32 is disconnected. Since the magnetic attraction force between the second magnetic member 32 and the third magnetic member 35 no longer exists, therefore the elastic restoring force of each elastic element 34 pushes each movable sleeve 33 in a direction away from the chassis 1 to drive the mutually attracted first magnetic member 31 and third magnetic member 35 to move away from the chassis 1. As a result, the spacing between the chassis 1 and the cover 2 formed by lifting the lifting mechanism 3 improves the internal air circulation and heat dissipation inside the chassis structure 10, so as to improve the heat dissipating efficiency.

Figure 11:
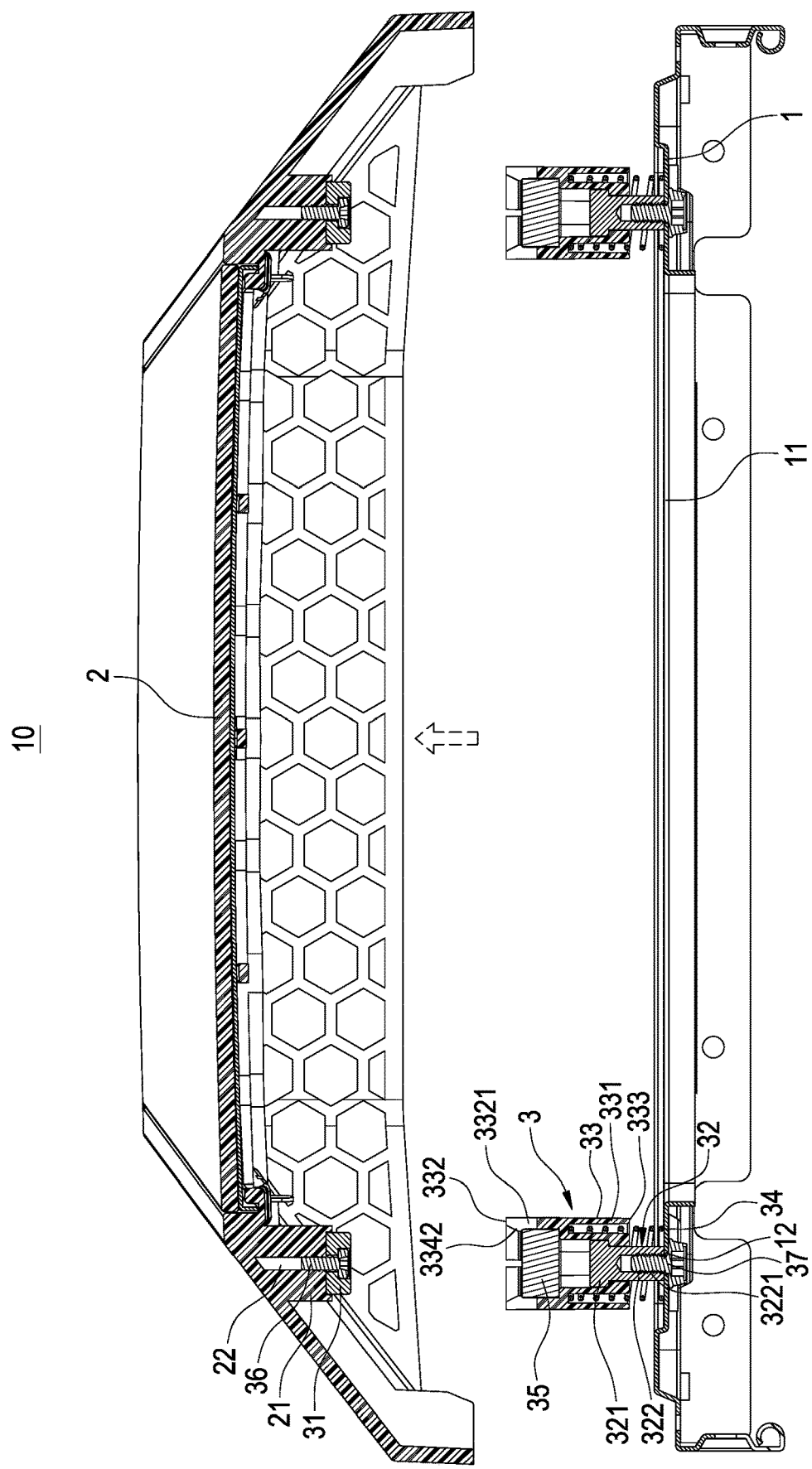
FIG. 11 is a third using status of a chassis structure of this disclosure.

In the third using status as shown in FIG. 11, the cover 2 is pulled further away from the chassis 1, so that the magnetic attraction between each third magnetic member 35 and each first magnetic member 31 is disconnected, and the cover 2 and the first magnetic member 31 are jointly separated from the lifting mechanism 3 to achieve the effect of detaching the cover 2 of the chassis 1. When the cover 2 is detached from the chassis 1, the opening 11 is exposed, so that the heat inside the chassis structure 10 can be dissipated through the opening 11 by air circulation and the heat dissipating efficiency of the chassis structure 10 is improved.

Figure 12:
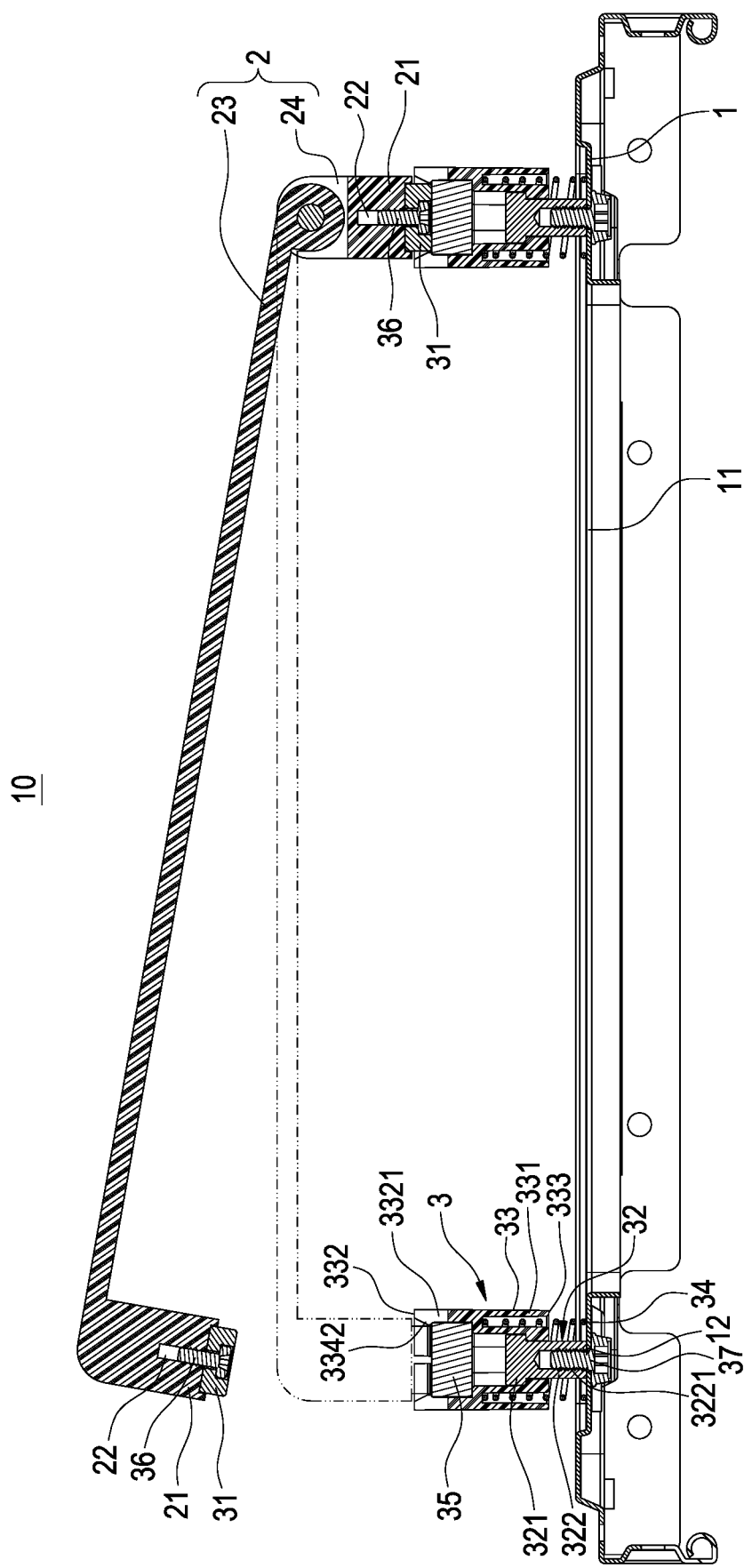
FIG. 12 is a schematic view of a using status of a chassis structure in accordance with another embodiment of this disclosure.

With reference to FIG. 12 for a chassis structure 10 in accordance with another embodiment of this disclosure, this embodiment is substantially the same as the embodiment as shown in FIGS. 1 to 11, and the main difference between this embodiment and the other embodiments resides on that the cover 2 includes a main body 23 and a pivot 24 pivotally coupled to the main body 23.

Specifically, the pivot 24 of this embodiment is pivotally coupled to a side of the main body 23, and the quantity of lugs 21 is plural, and a portion of the lugs 21 is integrally formed and extended from the pivot 24 and another portion of the lugs 21 is integrally formed and extended from the main body 23. The magnetic attraction between the third magnetic member 35 of the main body 23 and the first magnetic member 31 is disconnected. When the third magnetic member 35 of the pivot 24 and the first magnetic member 31 are magnetically attracted, the main body 23 is rotated by using the pivot 24 as the center and opened away from the chassis 1 to expose the opening 11, so that the chassis structure 10 can improve the heat dissipating efficiency of the chassis structure 10 by the air current passing through the opening 11.

Figure 13:
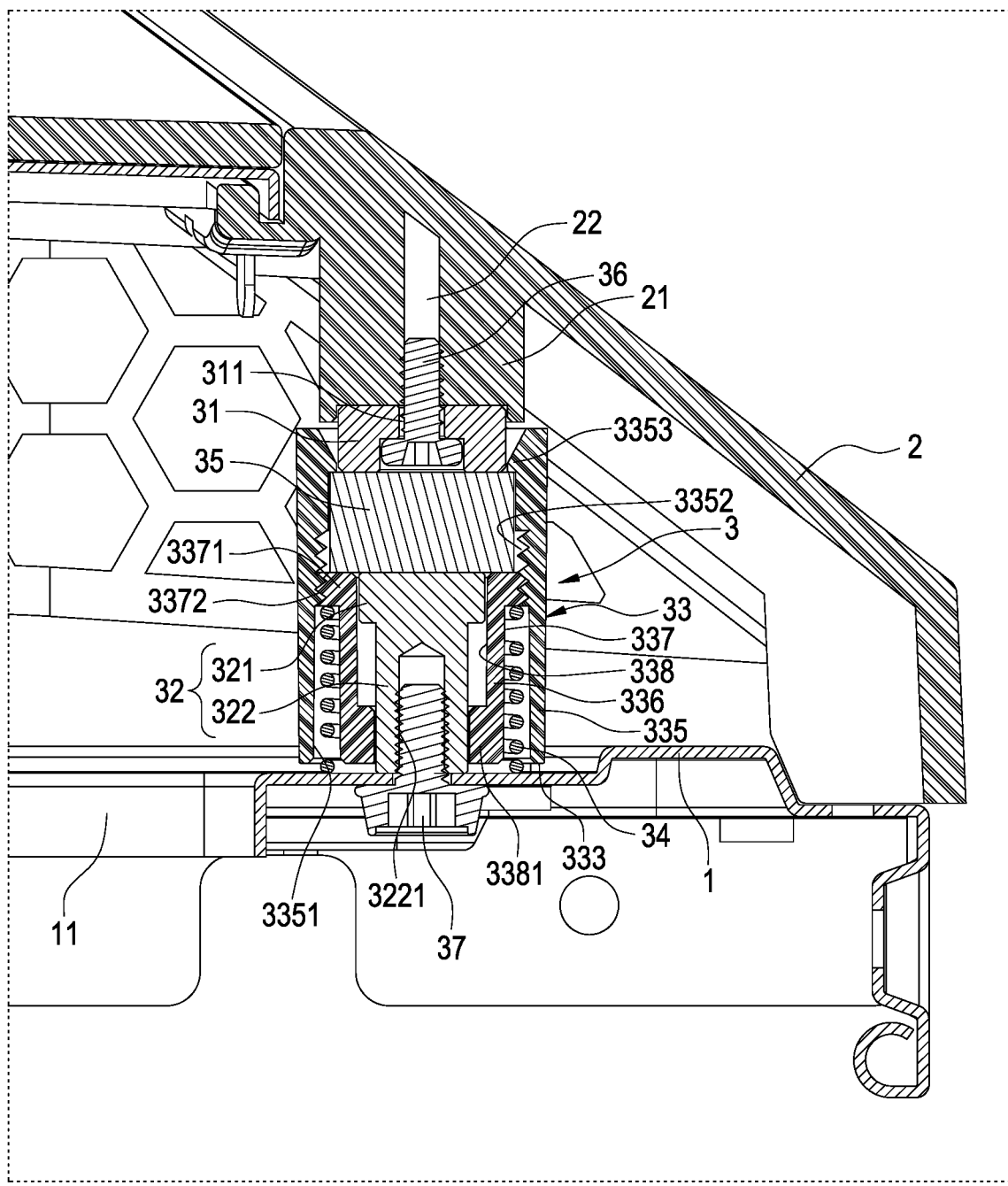
FIG. 13 is a partial sectional blowup view of a chassis structure in accordance with another embodiment of this disclosure.

With reference to FIG. 13 for a chassis structure 10 in accordance with a further embodiment of this disclosure, this embodiment is substantially the same as the embodiment as shown in FIGS. 1 to 11, and the main difference between this embodiment and the other embodiments resides on that the movable sleeve 33 has different components, and the movable sleeve 33 comprises a first cylindrical member 335 and a second cylindrical member 336.

Further, the second cylindrical member 336 is passed and installed to the first cylindrical member 335, and the first cylindrical member 335 has a first inner peripheral wall 3351, and the first inner peripheral wall 3351 has an inner thread 3352, and the first inner peripheral wall 3351 has an inner ring block 3353 disposed at an end extended away from the second cylindrical member 336.

The second cylindrical member 336 has an outer wall 337 and a second inner peripheral wall 338, and an outer ring block 3371 is extended from the outer wall 337, and the outer ring block 3371 has an outer thread 3372, and an inner ring 3381 is extended from the second inner peripheral wall 338.

Wherein, the outer thread 3372 of the second cylindrical member 336 is screwed and engaged with the inner thread 3352 of the first cylindrical member 335, so that the second cylindrical member 336 is passed and secured to the interior of the first cylindrical member 335.

In addition, the elastic element 34 is accommodated between the first inner peripheral wall 3351, the outer wall 337 and the outer ring block 3371, and the inner ring 3381 and the head portion 321 stop and limit one another, and the third magnetic member 35 is installed between the inner ring block 3353 and the outer ring block 3371, so as to achieve the same functions and effects of the embodiments as shown in FIGS. 1 to 11.

In summation of the description above, this disclosure discloses an innovative product capable of achieving the expected effects and overcoming the drawbacks of the prior art, and complies with the patent application requirements, and is thus filed for patent application. While the invention has been described by means of specific embodiments, numerous modifications and variations could be made thereto by those skilled in the art without departing from the scope and spirit of the invention set forth in the claims.

What is claimed is:

1. A magnetic securing mechanism for securing a first member to a second member, comprising:
    a first magnetic member positioned on one of the first and second members;
    a second magnetic member positioned on the other one of the first and second members;
    a movable sleeve, sheathed on the second magnetic member, and capable of sliding with respect to the second magnetic member;
    an elastic element, pushing and driving the movable sleeve to move away from the second magnetic member to restore its original position; and
    a third magnetic member, fixed to the movable sleeve, and configured to magnetically interact with the first and second magnetic members;
    wherein the magnetic securing mechanism is positioned between 1) a closed position, wherein the first magnetic member and the second magnetic member are attracted to each side of the third magnetic member and the magnetic attraction force between the second magnetic member and the third magnetic member being greater than the elastic restoring force of the elastic element 2) a middle position, wherein an external force detach the attraction between the second magnetic member and the third magnetic member and maintain the first magnetic member attracted to the third magnetic member; and 3) an open position, where further application of the external force detach the attraction between the first and third magnetic members.

2. The magnetic securing mechanism of claim 1, wherein the second magnetic member has a head portion and a rod portion, and the head portion has an external diameter greater than the external diameter of the rod portion.

3. The magnetic securing mechanism of claim 2, wherein the movable sleeve is a cylindrical member, and the cylindrical member has a top wall, a bottom wall and an inner ring wall, and an annular groove is inwardly formed on the bottom wall, and the elastic element is contained in the annular groove, and a first latch block is extended from the inner ring wall and configured to be near the bottom wall, and the first latch block and the head portion are stopped and limited by one another.

4. The magnetic securing mechanism of claim 3, wherein the top wall has a plurality sectional grooves inwardly formed along the axial direction of the cylindrical member, and the inner ring wall has a plurality of second latch blocks configured to be corresponsive to the plurality of sectional grooves respectively and having a thickness gradually increasing in a direction away from the top wall, and the inner ring wall further having a third latch block disposed between the first latch block and the second latch block, and the third magnetic member between the cylindrical member, the plurality of second latch blocks and the third latch block.

5. The magnetic securing mechanism of claim 2, wherein the movable sleeve includes a first cylindrical member and a second cylindrical member, and the second cylindrical member is passed and installed to the first cylindrical member, and the first cylindrical member has a first inner peripheral wall, and the first inner peripheral wall has an inner thread, and the second cylindrical member has an outer wall and a second inner peripheral wall, and the outer wall has an outer ring block, and the outer ring block has an outer thread, and the outer thread is screwed to the inner thread, and the elastic element is accommodated between the first inner peripheral wall, the outer wall and the outer ring block, and the second inner peripheral wall has an inner ring and the inner ring and the head portion stop and limit one another.

6. The magnetic securing mechanism of claim 5, wherein the first inner peripheral wall has an inner ring block extended from an end far away from the second cylindrical member, and the third magnetic member is installed between the inner ring block and the outer ring block.

7. The magnetic securing mechanism of claim 1, wherein the first magnetic member and the second magnetic member are magnets, and the third magnetic member is made of a magnetized material.

8. The magnetic securing mechanism of claim 1, wherein the first magnetic member and the second magnetic member are made of a magnetized material, and the third magnetic member is a magnet.

9. A cover structure, comprising:
a cover; and
at least one magnetic securing mechanism, further comprising:
  a first magnetic member, fixed to the cover;
  a second magnetic member;
  a movable sleeve, sheathed on the second magnetic member and capable of sliding with respect to the second magnetic member;
  an elastic element, pushing and driving the movable sleeve to move away from the second magnetic member and resume its original position; and
  a third magnetic member, fixed to the movable sleeve, and configured to magnetically interact with the first and second magnetic members;
  wherein the magnetic securing mechanism is positioned between 1) a closed position, wherein the first magnetic member and the second magnetic member are attracted to each side of the third magnetic member and the magnetic attraction force between the second magnetic member and the third magnetic member being greater than the elastic restoring force of the elastic element 2) a middle position, wherein an external force detach the attraction between the second magnetic member and the third magnetic member and maintain the first magnetic member attracted to the third magnetic member; and 3) an open position, where further application of the external force detach the attraction between the first and third magnetic members.

10. The cover structure of claim 9, wherein the cover has at least one lug extended therefrom, and the lug has a first screw hole, and the first magnetic member has a second screw hole, and the magnetic securing mechanism further includes a first screw screwed and secured into the first screw hole and the second screw hole.

11. The cover structure of claim 10, wherein the cover includes a main body and a pivot pivotally coupled to the main body, and the lug is formed and extended from the pivot or the main body.

12. The cover structure of claim 9, wherein the second magnetic member has a head portion and a rod portion, and the head portion has an external diameter greater than the external diameter of the rod portion.

13. The cover structure of claim 12, wherein the movable sleeve is a cylindrical member having a top wall, a bottom wall and an inner ring wall, and the bottom wall has an annular groove concavely formed on the bottom wall, and the elastic element is accommodated in the annular groove, and the inner ring wall has a first latch block disposed adjacent to the bottom wall, and the first latch block stops and limits the head portion.

14. The cover structure of claim 13, wherein the top wall has a plurality of sectional groves inwardly formed along the axial direction of the cylindrical member, and the inner ring wall has a plurality of second latch blocks extended and disposed between the plurality of sectional grooves and having a thickness gradually increasing in a direction away from the top wall, and the inner ring wall has a third latch block extended and disposed between the first latch block and the second latch block, and the third magnetic member is installed between the cylindrical member, the plurality of second latch blocks, and the third latch block.

15. The cover structure of claim 12, wherein the movable sleeve includes a first cylindrical member and a second cylindrical member, and the second cylindrical member is passed and installed to the first cylindrical member, and the first cylindrical member has a first inner peripheral wall, and the first inner peripheral wall has an inner thread, and the second cylindrical member has an outer wall and a second inner peripheral wall, and the outer wall has an outer ring block extended therefrom, and the outer ring block has an outer thread, and the outer thread is screwed to the inner thread, and the elastic element is accommodated between the first inner peripheral wall, the outer wall and the outer ring block, and the second inner peripheral wall has an inner ring extended therefrom, and the inner ring and the head portion stop and limit one another.

16. The cover structure of claim 15, wherein the first inner peripheral wall has an inner ring block extended from an end away from the second cylindrical member, and the third magnetic member is installed between the inner ring block and the outer ring block.

17. A chassis device, comprising:
a chassis, having an opening;
a cover, covered onto the opening; and
at least one magnetic securing mechanism, further comprising:
  a first magnetic member, fixed to the cover;
  a second magnetic member, fixed to the chassis;
  a movable sleeve, sheathed on the second magnetic member, and capable of sliding with respect to the second magnetic member;
  an elastic element, installed between the chassis and the movable sleeve, and the elastic element pushes and drives the movable sleeve away from the chassis to resume its original position; and
  a third magnetic member, fixed to the movable sleeve, and configured to magnetically interact with the first and second magnetic members;
  wherein the magnetic securing mechanism is positioned between 1) a closed position, wherein the first magnetic member and the second magnetic member are attracted to each side of the third magnetic member and the magnetic attraction force between the second magnetic member and the third magnetic member being greater than the elastic restoring force of the elastic element 2) a middle position, wherein an external force detach the attraction between the second magnetic member and the third magnetic member and maintain the first magnetic member attracted to the third magnetic member; and 3) an open position, where further application of the external force detach the attraction between the first and third magnetic members.

18. The chassis device of claim 17, wherein the second magnetic member has a head portion and a rod portion, and the head portion has an external diameter greater than the external diameter of the rod portion, and the rod portion is fixed to the chassis.

19. The cover structure of claim 18, wherein the movable sleeve is a cylindrical member, and the cylindrical member has a top wall, a bottom wall and an inner ring wall, and the bottom wall has an annular groove inwardly formed on the bottom wall, and the elastic element is accommodated in the annular groove, and the inner ring wall has a first latch block disposed adjacent to the bottom wall, and the first latch block and the head portion stop and limit one another.

20. The cover structure of claim 19, wherein the top wall has a plurality of sectional grooves inwardly formed along the axial direction of the cylindrical member, and the inner ring wall has a plurality of second latch blocks disposed between the plurality of sectional grooves and having a thickness gradually increasing in a direction away from the top wall, and the inner ring wall further has a third latch block disposed between the first latch block and the second latch block, and the third magnetic member is installed between the cylindrical member, the plurality of second latch blocks, and the third latch block.

21. The cover structure of claim 18, wherein the movable sleeve includes a first cylindrical member and a second cylindrical member, and the second cylindrical member is passed and installed to the first cylindrical member, and the first cylindrical member has a first inner peripheral wall, and the first inner peripheral wall has an inner thread, and the second cylindrical member has an outer wall and a second inner peripheral wall, and the outer wall has an outer ring block extended therefrom, and the outer ring block has an outer thread screwed to the inner thread, and the elastic element is accommodated between the first inner peripheral wall, the outer wall and the outer ring block, and the second inner peripheral wall has an inner ring extended therefrom, and the inner ring and the head portion stop and limit one another.

22. The cover structure of claim 21, wherein the first inner peripheral wall has an inner ring block extended from an end far away from the second cylindrical member, and the third magnetic member is installed between the inner ring block and the outer ring block.

23. The cover structure of claim 18, wherein the chassis has at least one first locking hole disposed adjacent to the opening, and the rod portion has a second locking hole, and the magnetic securing mechanism further comprises a second screw screwed and secured into the first locking hole and the second locking hole.

24. The chassis device of claim 17, wherein the cover has at least one lug extended therefrom, and the lug has a first screw hole, and the first magnetic member has a second screw hole, and the magnetic securing mechanism further comprises a first screw screwed and secured to the first screw hole and the second screw hole.

25. The chassis device of claim 24, wherein the cover includes a main body and a pivot pivotally coupled to the main body, and the lug is formed and extended from the pivot or the main body.

26. The chassis device of claim 17, wherein the magnetic securing mechanism comes with a plural quantity and the magnetic securing mechanisms are installed around the periphery of the opening.

\* \* \* \* \*